(12) United States Patent
Tanaka (10) Patent No.: US 9,026,746 B2
(45) Date of Patent: May 5, 2015

(54) SIGNAL CONTROL DEVICE AND SIGNAL CONTROL METHOD

(75) Inventor: Shinjiro Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 969 days.

(21) Appl. No.: 13/066,266

(22) Filed: Apr. 11, 2011

(65) Prior Publication Data

US 2011/0264853 A1    Oct. 27, 2011

(30) Foreign Application Priority Data

Apr. 22, 2010 (JP) ................ P2010-099229

(51) Int. Cl.
| G06F 12/00 | (2006.01) |
| G06F 13/00 | (2006.01) |
| G06F 13/28 | (2006.01) |
| G06F 13/16 | (2006.01) |
| G11C 29/00 | (2006.01) |
| G06F 15/167 | (2006.01) |
| G11C 7/10 | (2006.01) |

(52) U.S. Cl.
CPC .............. *G06F 13/16* (2013.01); *G11C 29/818* (2013.01); *G06F 15/167* (2013.01); *G11C 7/1075* (2013.01)

(58) Field of Classification Search
None
See application file for complete search history.

(56) References Cited

U.S. PATENT DOCUMENTS

| 4,903,227 | A | * | 2/1990 | Fukushima | 713/601 |
| 4,937,781 | A | * | 6/1990 | Lee et al. | 711/149 |
| 5,157,775 | A | * | 10/1992 | Sanger | 711/5 |
| 5,276,842 | A | * | 1/1994 | Sugita | 711/149 |
| 5,329,630 | A | * | 7/1994 | Baldwin | 711/173 |
| 5,623,447 | A | * | 4/1997 | Shimoda | 365/189.04 |
| 5,751,638 | A | * | 5/1998 | Mick et al. | 365/189.04 |
| 5,777,762 | A | * | 7/1998 | Yamamoto | 398/51 |
| 5,914,728 | A | * | 6/1999 | Yamagishi et al. | 345/565 |
| 6,108,756 | A | * | 8/2000 | Miller et al. | 711/148 |

(Continued)

FOREIGN PATENT DOCUMENTS

| JP | 03-292695 A | 12/1991 |
| JP | 04-313132 A | 11/1992 |

(Continued)

OTHER PUBLICATIONS

Rad. Tolerant High Speed 8 Kb x 16 Dual Port RAM M67025E, Atmel, Apr. 2007, retrieved from http://www.atmel.com/Images/doc4146.pdf on Mar. 18, 2014 (27 pages).*

(Continued)

*Primary Examiner* — Tuan Thai
*Assistant Examiner* — Daniel C Chappell
(74) *Attorney, Agent, or Firm* — Sony Corporation (57) ABSTRACT

A signal control device includes: a dual port RAM from or to which data signals are read and written at predetermined operation timings by first and second CPUs connected to two ports, respectively; an address collision detection unit detecting collision between addresses in which the first and second CPUs respectively read and write the data signal from and to the dual port RAM; a first storage unit storing the data signal read by the first CPU; a second storage unit storing the data signal read from the address in which the second CPU writes the data signal to the dual port RAM when the collision between the addresses is detected; and a switching unit switching a reading source outputting the data signal to the port to which the first CPU is connected and outputting the read data signal to the first CPU entering a readable state.

11 Claims, 6 Drawing Sheets

(56) References Cited

U.S. PATENT DOCUMENTS

| | | | |
|---|---|---|---|
| 6,185,228 B1* | 2/2001 | Takashimizu et al. | 370/535 |
| 6,212,607 B1* | 4/2001 | Miller et al. | 711/149 |
| 6,446,149 B1* | 9/2002 | Moriarty et al. | 710/110 |
| 6,769,050 B1* | 7/2004 | Ware et al. | 711/154 |
| 6,785,782 B1* | 8/2004 | Ware et al. | 711/149 |
| 6,826,657 B1* | 11/2004 | Ware et al. | 711/149 |
| 6,961,831 B2* | 11/2005 | Ware et al. | 711/154 |
| 7,073,035 B2* | 7/2006 | Ware et al. | 711/154 |
| 7,471,340 B1* | 12/2008 | Chowdhury et al. | 348/572 |
| 7,474,724 B1* | 1/2009 | Gudmunson et al. | 375/376 |
| 7,499,106 B1* | 3/2009 | Gudmunson et al. | 348/536 |
| 7,627,232 B2* | 12/2009 | Tsunashima et al. | 386/344 |
| 7,639,561 B2* | 12/2009 | Lee et al. | 365/233.11 |
| 8,538,567 B2* | 9/2013 | Nakayama et al. | 700/94 |
| 8,621,159 B2* | 12/2013 | Ware et al. | 711/148 |
| 8,634,416 B2* | 1/2014 | Takashimizu et al. | 370/389 |
| 2003/0191623 A1* | 10/2003 | Salmonsen | 703/24 |
| 2003/0225568 A1* | 12/2003 | Salmonsen | 703/27 |
| 2004/0024580 A1* | 2/2004 | Salmonsen et al. | 703/27 |
| 2004/0049797 A1* | 3/2004 | Salmonsen | 725/132 |
| 2004/0054689 A1* | 3/2004 | Salmonsen et al. | 707/104.1 |
| 2006/0088279 A1* | 4/2006 | Tsunashima et al. | 386/46 |
| 2006/0088295 A1* | 4/2006 | Tsunashima et al. | 386/111 |
| 2007/0005334 A1* | 1/2007 | Salmonsen | 703/26 |
| 2007/0245094 A1* | 10/2007 | Lee et al. | 711/149 |
| 2010/0211748 A1* | 8/2010 | Perego et al. | 711/148 |
| 2011/0221968 A1* | 9/2011 | Takashimizu et al. | 348/726 |
| 2011/0230989 A1* | 9/2011 | Nakayama et al. | 700/94 |
| 2012/0079180 A1* | 3/2012 | Ren | 711/105 |

FOREIGN PATENT DOCUMENTS

| | | |
|---|---|---|
| JP | 05-023263 A | 2/1993 |
| JP | 06-019832 A | 1/1994 |

OTHER PUBLICATIONS

Realities of Multi-Core CPU Chips and Memory Contention, D.P. Barker, 17th Euromicro International Conference on Parallel, Distributed and Network-based Processing, Feb. 18-20, 2009, pp. 446-453 (8 pages).*

Programming With Transactional Memory, Brian David Carlstrom, Jun. 2008, retrieved from http://tcc.stanford.edu/publications/tcc_thesis_bdc.pdf on Mar. 18, 2014 (173 pages).*

Transactional Memory: Architectural Support for Lock-free Data Structures, Herlihy et al, Proceedings of the 20th Annual International Symposium on Computer Architecture, May 16-19, 1993, pp. 289-300 (12 pages).* clock speed, Webopedia, Apr. 5, 2001, retrieved from https://web.archive.org/web/20010405220048/http://webopedia.com/TERM/C/clock_speed.html on Mar. 19, 2014 (2 pages).*

* cited by examiner

SIGNAL CONTROL DEVICE AND SIGNAL CONTROL METHOD

CROSS-REFERENCE TO RELATED APPLICATION

The present application claims priority from Japanese Patent Application No. JP 2010-099229 filed in the Japanese Patent Office on Apr. 22, 2010, the entire content of which is incorporated herein by reference.

BACKGROUND OF THE INVENTION

1. Field of the Invention

The present invention relates to a signal control device and a signal control method suitable for simultaneous access to, for example, a dual port RAM.

2. Description of the Related Art

In the past, a dual port RAM through which two CPUs gain access to data was used. However, when two different CPUs simultaneously attempted reading/writing access to the dual port RAM, data was sometimes not guaranteed to be read. For example, when access collision occurs between the writing and the reading of data to and from the dual port RAM, there is a danger in which the data is read during the rewriting of the data due to a difference between access timings of the respective ports. In this case, there is a possibility of reading an undefined value. For this reason, even when the two CPU simultaneously gain access to the dual port RAM, the following various countermeasures have been adopted in order to correctly read the data.

(1) The collision is avoided by determining timings so that the reading and the writing of the respective CPUs do not overlap with each other.

(2) One CPU awaits a reading operation while the other CPU outputs a busy signal or the like during the writing of data to the dual port RAM.

(3) The collision is avoided by preparing two pairs of dual port RAMs to distribute respective accesses and the details of the RAMs are merged when there is no bus access (Japanese Unexamined Utility Model Registration Application Publication No. 5-23263).

(4) Written data is latched (Japanese Unexamined Patent Application Publication No. 6-19832, Japanese Unexamined Patent Application Publication No. 4-313132, and Japanese Unexamined Patent Application Publication No. 3-292695).

SUMMARY OF THE INVENTION

However, when an access timing is determined or a CPU waits using the techniques disclosed in the above-described techniques (1) and (2), restriction on the CPU or waste of time may occur or a timing of access to the CPU may be restricted. Moreover, when the technique (3) is used, a large amount of resources for the merging is necessary, thereby increasing manufacturing cost.

When the technique (4) is used, it is necessary to latch the written data and perform post-writing to the dual port RAM. Therefore, a post-writing circuit has to be embedded. For this reason, the size of a circuit controlling the dual port RAM is increased and the controlling of the dual port RAM becomes complicated. Moreover, addresses and written data have to be held even after a "Write Enable" state ends. Therefore, this technique is not suitable for continuous writing in a very short cycle.

In the light of the foregoing, it is desirable to provide a signal control device and a signal control method capable of correctly reading a data signal when two CPUs perform reading or writing of data from or to a dual port RAM at the same timing.

According to an embodiment of the invention, a dual port RAM is used from or to which data signals are read and written at predetermined operation timings by first and second CPUs connected to two ports, respectively.

Collision is detected between an address in which the first CPU reads the data signal from the dual port RAM and an address in which the second CPU writes the data signal to the dual port RAM.

A first storage unit stores the data signal which the first CPU reads from the dual port RAM. A second storage unit stores the data signal read from the address in which the second CPU writes the data signal to the dual port RAM irrespective of whether the second CPU is in a writable state, when the collision between the addresses is detected and the first CPU is not in a readable state.

The data signal is read from the first storage unit when the collision between the addresses is not detected and the first CPU is in the readable state. The data signal is read from the first storage unit irrespective of whether the second CPU is in the writable state, when the collision between the addresses is detected and the first CPU is not in the readable state. On the other hand, the data signal is read from the second storage unit when the collision between the addresses is detected, the first CPU is not in the readable state, and the second CPU is in the writable state. Thus, by switching a reading source outputting the data signal to the port to which the first CPU is connected, the read data signal is output to the first CPU entering the readable state.

Accordingly, when the first and second CPUs simultaneously read and write the data signal from and to the dual port RAM, respectively, the data signal can correctly be read from the dual port RAM in spite of the collision between the reading address and the writing address.

According to the embodiment of the invention, the reading source of the data signal is switched based on the readable state of the first CPU and the writable state of the second CPU when the first and second CPUs read and write the data signal from and to the dual port RAM, respectively. Therefore, the access to the data of the same address can be gained at an arbitrary timing without depending on the operation speed of each CPU. At this time, since it is not necessary for the CPU performing the reading to wait until the CPU performing the writing completes the process, the advantage of reading the data signal at a high speed can be obtained.

DESCRIPTION OF THE PREFERRED EMBODIMENTS

Hereinafter, preferred embodiments (hereinafter, referred to as embodiments) of the invention will be described. The description thereof will be made in the following order.

1. First Embodiment (Access Control of Dual Port RAM: Example in Which Two CPUs Simultaneously Perform Reading/Writing from and to Dual Port RAM).

1. First Embodiment

Access Control of Dual Port RAM: Example in Which Two CPUs Simultaneously Perform Reading/Writing from and to Dual Port RAM Hereinafter, an embodiment of the invention will be described with reference to the accompanying drawings. In this embodiment, an example will be described in which when one CPU reads a data signal (hereinafter, referred to as "data") from a dual port RAM and the other CPU writes the data, a signal control device 4 performs control so that the read data is not undefined.

Figure 1:
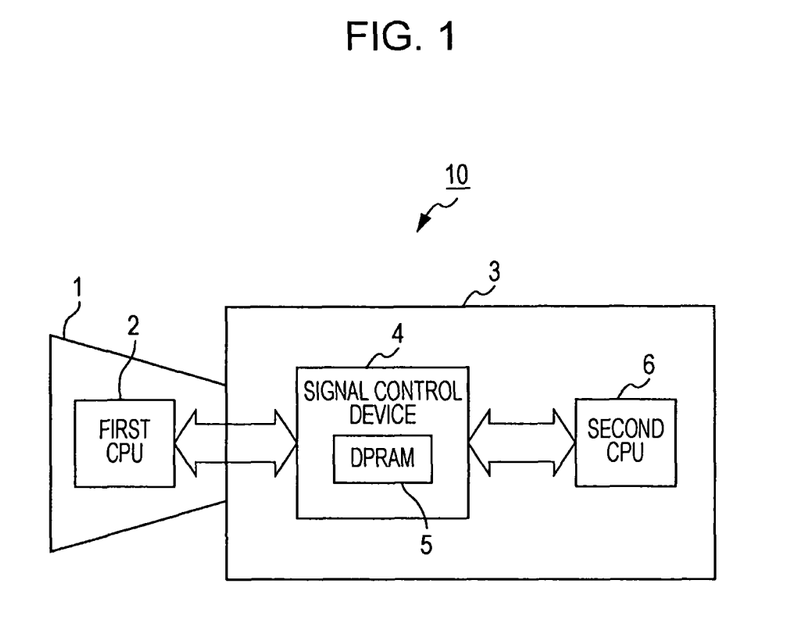
FIG. 1 is a block diagram illustrating an exemplary inner configuration of a video processing system according to an embodiment of the invention.

FIG. 1 is a diagram illustrating an exemplary inner configuration of a video processing system 10.

The video processing system 10 processing a video photographed by a camera 1 includes the camera 1 that photographs a subject and a recording apparatus 3 that records a video. The recording apparatus 3 has a recording medium (not shown), such as a video tape or an HDD, with a large capacity to record the video. The camera 1 includes a first CPU 2 that controls an operation of a processing block (not shown) of the camera 1 and that outputs various control signals to the recording apparatus 3 or reads the data.

The recording apparatus 3 includes a second CPU 6 that controls an operation of a processing block (not shown) of the recording apparatus 3. The recording apparatus 3 includes a dual port RAM 5 that is used to transmit and receive data between the first CPU 2 and the second CPU 6 and a signal control device 4 that controls access of the first CPU 2 and the second CPU 6 gaining access to the dual port RAM 5.

The camera 1 and the recording apparatus 3 share data, such as a time code, recorded in the dual port RAM 5 using the first CPU 2 and the second CPU 6 built in the camera and the recording apparatus 3, respectively. In this embodiment, the first CPU 2 operates at about 33 MHz and transmits data with a 16-bit bus. On the other hand, the second CPU 6 operates at about 74 MHz and transmits data with an 8-bit bus. In the dual port RAM 5, reading or writing the data signal is performed at predetermined operation timings by the first and second CPUs connected to two ports, respectively.

The signal control device 4 has a function of reading and buffering the data of addresses before the writing when the referred addresses of the reading and the writing which the first CPU 2 and the second CPU 6 ask of the dual port RAM 5 collide with each other. Moreover, the signal control device 4 prevents the CPU from reading an undefined value by switching between reading of the buffered data and reading of the data on the dual port RAM, as necessary.

Figure 2:
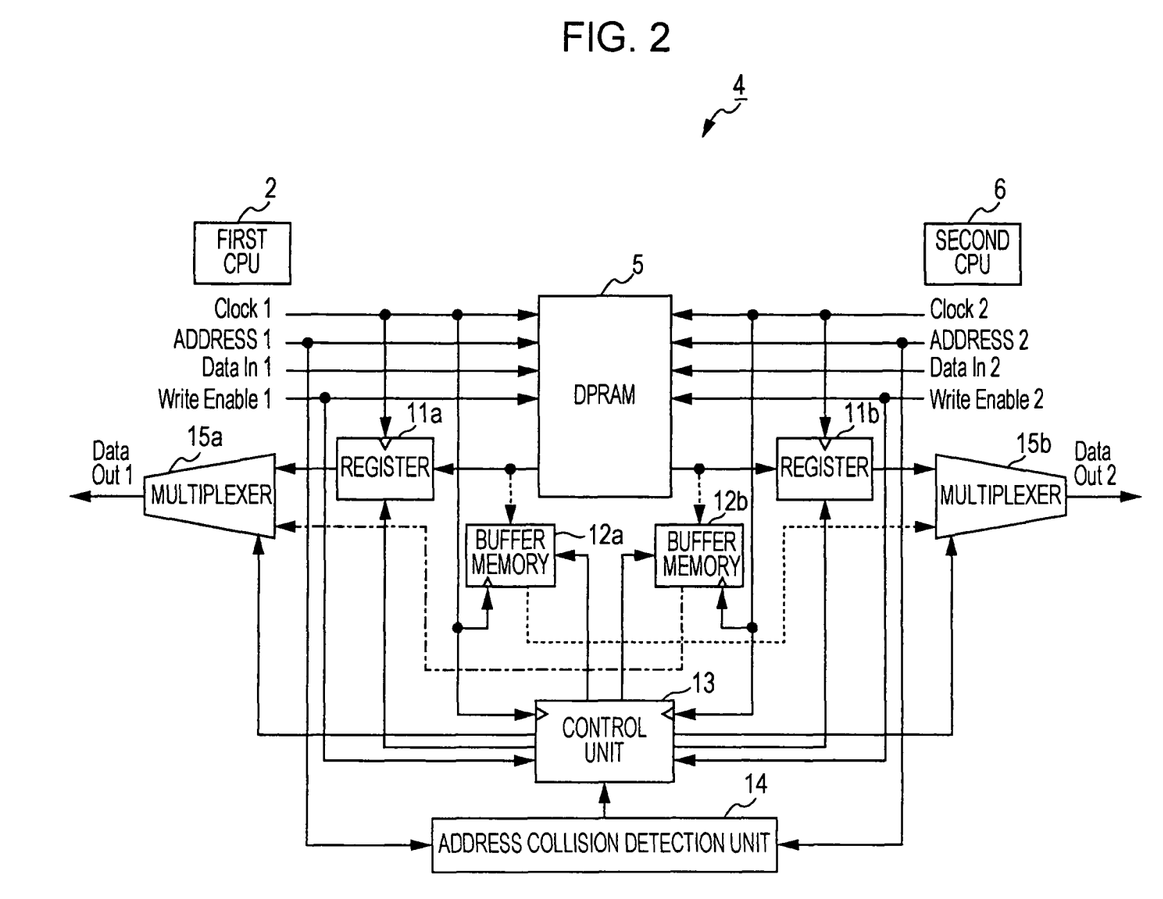
FIG. 2 is a block diagram illustrating an exemplary inner configuration of a signal control device according to the embodiment of the invention.

FIG. 2 is a diagram illustrating an exemplary inner configuration of the signal control device 4.

First CPU 2

The signal control device 4 includes a register 11a as a first storage unit temporarily holding the data signal read from the dual port RAM 5 by the first CPU 2, as a processing block used in the reading on the side of the first CPU 2. The signal control device 4 further includes a buffer memory 12a as a second storage unit storing the data signal read from the address in which the data signal is written to the dual port RAM 5 by the second CPU 6, when address collision is detected. The signal control device 4 further includes a multiplexer 15a as a switching unit selecting the data signal stored in one of the register 11a and the buffer memory 12a and switching to the selected data signal for output.

Second CPU 6

The signal control device 4 includes a register 11b as a first storage unit temporarily holding the data signal read from the dual port RAM 5 by the second CPU 6, as a processing block used in the reading on the side of the second CPU 6. The signal control device 4 further includes a buffer memory 12b as a second storage unit storing the data signal read from the address in which the data signal is written to the dual port RAM 5 by the first CPU 2, when address collision is detected. The signal control device 4 further includes a multiplexer 15b as a switching unit selecting the data signal stored in one of the register 11b and the buffer memory 12b and switching to the selected data signal for output.

The signal control device 4 includes a control unit that controls the import of the data signals of the registers 11a and 11b, the buffer memories 12a and 12b, and the multiplexers 15a and 15b or controls the switching of the data signals to be output. The signal control device 4 further includes an address collision detection unit 14 detecting collision between the address in which the first CPU reads the data signal from the dual port RAM 5 and the address in which the second CPU 6 writes the data signal to the dual port RAM 5.

Next, an exemplary operation of each unit of the signal control device 4 will be described.

Here, it is assumed that the first CPU 2 reads the data signal from the dual port RAM 5 and the second CPU 6 writes the data signal to the dual port RAM 5.

At this time, the register 11a stores the data signal read from the dual port RAM 5 by the first CPU 2. The buffer memory 12b performs the following operation when the first CPU 2 is not in the readable state. That is, the buffer memory 12b stores the data signal read from the address to which the second CPU 6 writes the data signal to the dual port RAM 5, irrespective of whether the second CPU 6 is in the readable state.

The multiplexer 15a reads the data signal from the register 11a when address collision is not detected and the first CPU 2 is in the readable state. Moreover, the multiplexer 15a reads the data signal from the register 11a irrespective of whether the second CPU 6 is in the readable state, when address collision is detected and the first CPU 2 is not in the readable state. On the other hand, the multiplexer 15a reads the data signal from the buffer memory 12b, when address collision is detected, the first CPU 2 is not in the readable state, and the second CPU 6 is in the writable state. In this way, by switching a reading source outputting the data signal to the port to which the first CPU is connected, the read data signal is output to the first CPU 2 which is in the readable state. When the first CPU 2 writes the data signal to the dual port RAM 5 and the second CPU 6 reads the data signal from the dual port RAM 5, the above-described operations are performed by the processing blocks provided to correspond to all the units.

Next, exemplary processing of each unit when the first CPU 2 reads the data signal and the second CPU 6 writes the data signal will be described with reference to FIG. 3A to 5C. When the roles are reversed (the first CPU 2 writes the data signal and the second CPU 6 reads the data signal), the basic operation is the same in the fact that the opposite register and buffer memory are used. In FIGS. 3A to 5C, the hatched part indicates a collision section and the data being read and written is shown as the data signal. The timing charts in FIGS. 3A to 5C are shown chronologically and numerals shown in FIGS. 3A to 5C correspond to numerals shown in steps of the flowchart (see FIG. 6) described below.

A pattern of the address collision is classified into the following three patterns:

(1) a case where the reading of the first CPU 2 and the writing of the second CPU 6 occur at the same timing from the start up of a clock;

(2) a case where the writing of the second CPU 6 collides during the reading of the first CPU 2; and (3) a case where the reading of the first CPU 2 collides during the writing of the second CPU 6.

The speed of the two CPUs can be classified into the following three patterns:

(1) a case where the speeds of the first CPU 2 and the second CPU 6 are the same as each other;

(2) a case where the speed of the first CPU 2 is faster than that of the second CPU 6; and (3) a case where the speed of the first CPU 2 is slower than that of the second CPU 6.

Examples of the operations at the address collision in the respective cases (nine combinations) and the read data signals will be described.

Figure 3A:
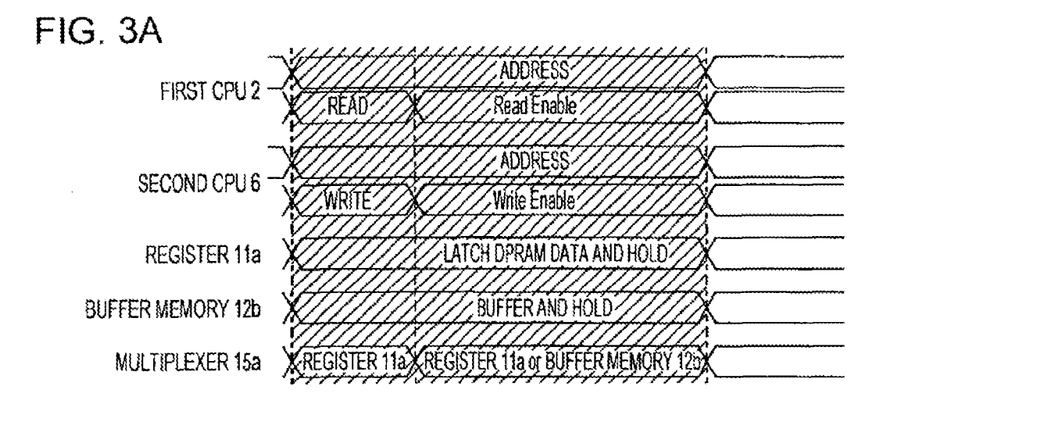
FIGS. 3A to 3C are timing charts illustrating an example in which reading of a first CPU and writing of a second CPU occur at the same timing according to the embodiment of the invention.
Figure 3B:
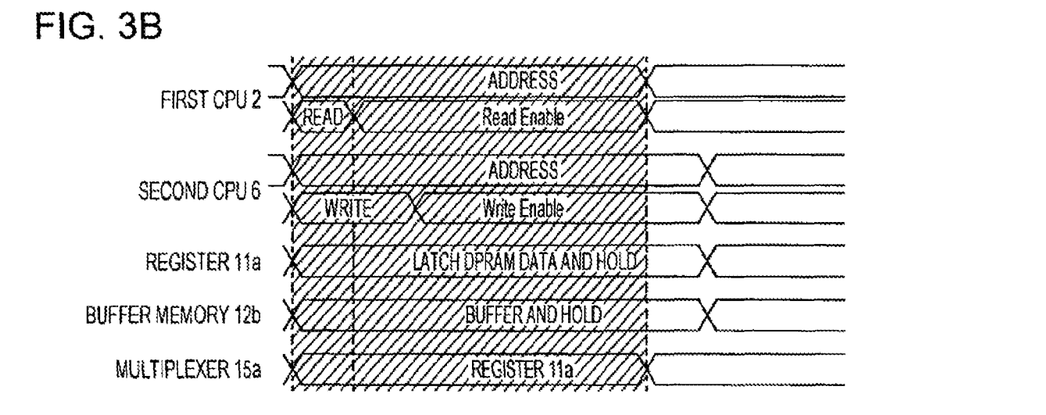
Figure 3C:
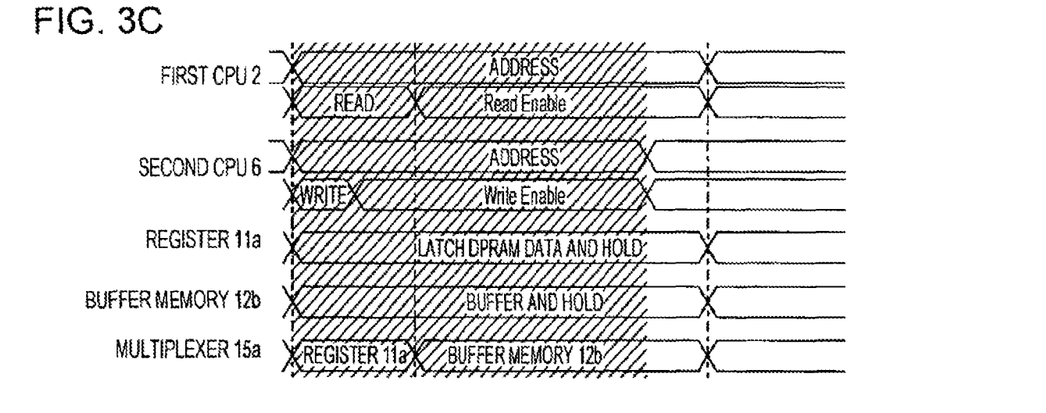

1. Case Where Reading of First CPU 2 and Writing of Second CPU 6 Occurs at Same Timing FIGS. 3A to 3C are timing charts illustrating an example in which the reading of the first CPU 2 and the writing of the second CPU 6 occur at the same timing. In the following description, when "Read" and "Write" are described, it does not mean that reading or writing data from or to the dual port RAM 5 actually starts. In this state, preparation of "Read" or "Write" starts and actual reading or writing is performed when a "Read Enable" state (readable state) or a "Write Enable" state (Writable state) is entered.

Here, the multiplexers 15a and 15b perform the following process when a timing at which the first CPU 2 reads the data signal from the dual port RAM 5 is the same as a timing at which the second CPU 6 writes the data signal to the dual port RAM 5. At this time, it is necessary to detect the address collision. The multiplexers 15a and 15b switch the registers 11a and 11b and the buffer memories 12a and 12b reading the data signals output by the multiplexers 15a and 15b in accordance with the operation speeds of the first CPU 2 and the second CPU 6, respectively.

Specifically, multiplexer 15a and 15b output the data signals written to the first or second storage unit by the first CPU 2 when the operation timing of the first CPU 2 is the same as that of the second CPU 6. When the operation speed of the first CPU 2 is faster than the operation speed of the second CPU 6, the first CPU 2 outputs the data signal written to the buffer memory 12b. When the operation speed of the first CPU 2 is slower than the operation speed of the second CPU 6, the second CPU 6 outputs the data signal written to the buffer memory 12b.

Hereinafter, a detailed processing example will be described.

1-1. Case Where Speeds of First CPU 2 and Second CPU 6 are same as Each Other (FIG. 3A)

(1) First, the first CPU 2 latches the data read from the dual port RAM 5 in the register 11a.

(2) Next, the address collision detection unit 14 detects the address collision.

(3) When the address collision detection unit 14 detects the address collision, the output of the dual port RAM 5 is buffered in the buffer memory 12b.

(4) When the first CPU 2 enters the "Read Enable" state, stable data can be obtained by reading the data from any of the register 11a and the buffer memory 12b.

(5) The second CPU 6 usually writes the data to the dual port RAM 5 in accordance with the "Write Enable" state.

1-2. Case Where Operation Speed of First CPU 2 is Faster than That of Second CPU 6 (FIG. 3B)

In this case, the process is performed in the same way as that of 1-1. However, the first CPU 2 enters the "Read Enable" state, before the second CPU 6 enters the "Write Enable" state. Therefore, the multiplexer 15a outputs the data read from the register 11a to the first CPU 2. As a consequence, the first CPU 2 reads the data from the register 11a.

1-3. Case Where Operation Speed of First CPU 2 is Slower than That of Second CPU 6 (FIG. 3C)

In this case, the process is performed in the same way as that of 1-1. However, the second CPU 6 enters the "Write Enable" state while the first CPU 2 prepares the reading. Therefore, the multiplexer 15a outputs the data read from the buffer memory 12b to the first CPU 2. As a consequence, the first CPU 2 reads the data from the buffer memory 12b.

Figure 4A:
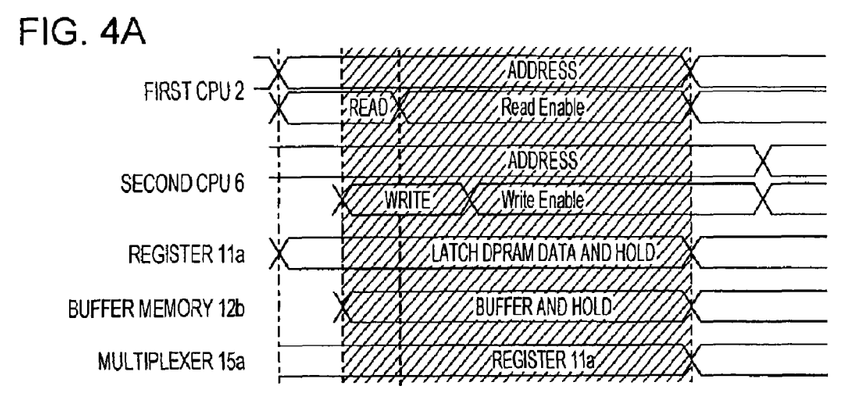
FIGS. 4A to 4C are timing charts illustrating an example in which the writing of the second CPU collides during the reading of the first CPU according to the embodiment of the invention.
Figure 4B:
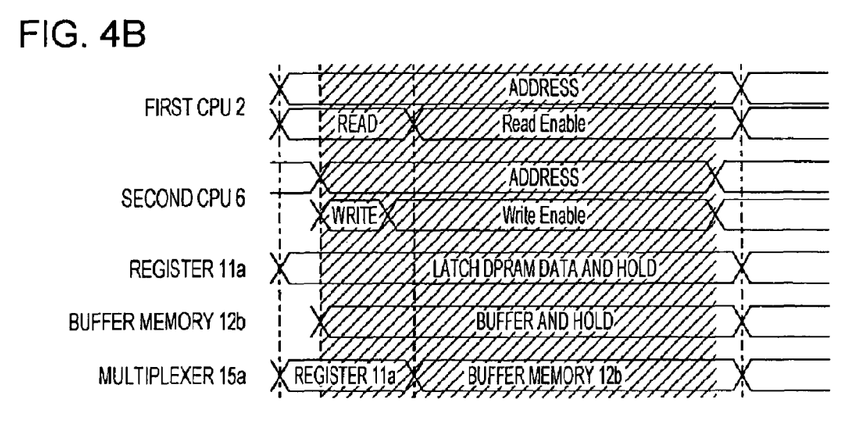
Figure 4C:
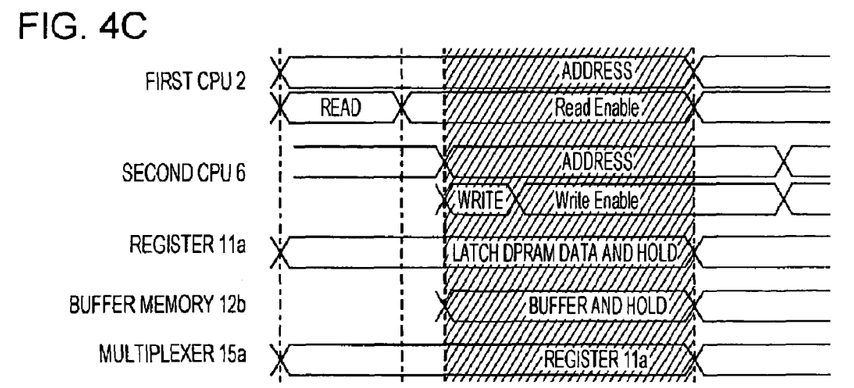

2. Case Where Writing of Second CPU 6 Collides During reading of First CPU 2

FIGS. 4A to 4C are timing charts illustrating an example in which the writing of the second CPU 6 collides during the reading of the first CPU 2.

Here, the multiplexers 15a and 15b perform the following process when the second CPU 6 writes the data signal to the dual port RAM 5 during a period in which the first CPU reads the data signal from the dual port RAM 5. At this time, it is necessary to detect the address collision. The multiplexers 15a and 15b switch the buffer memory 12b reading the data signals output by the multiplexers 15a and 15b in accordance with the operation speeds of the first CPU 2 and the second CPU 6, respectively.

Specifically, multiplexer 15a and 15b output the data signals written to the register 11a by the first CPU 2 when the operation timing of the first CPU 2 is the same as that of the second CPU 6. When the operation speed of the first CPU 2 is faster than the operation speed of the second CPU 6, the first CPU 2 outputs the data signal written to the buffer memory 12b. When the operation speed of the first CPU 2 is slower than the operation speed of the second CPU 6 and the first CPU 2 prepares to read the data signal from the dual port RAM 5, the second CPU 6 outputs the data signal written to the buffer memory 12b. When the operation speed of the first CPU 2 is slower than the operation speed of the second CPU 6 and the first CPU 2 reads the data signal from the dual port RAM 5, the first CPU 2 outputs the data signal written to the register 11a.

Hereinafter, a detailed processing example will be described.

2-1. Case Where Speeds of First CPU 2 and Second CPU 6 are Same as Each Other (FIG. 4A)

In this case, the process is performed both before and during the "Read Enable" state.

(1) The data read from the dual port RAM 5 is latched in the register 11a.

(2) The address collision detection unit 14 detects the address collision.

(3) When the address collision detection unit 14 detects the address collision, the output of the dual port RAM 5 is buffered in the buffer memory 12b.

(4) Since the latching of the register 11a ends before the "Write Enable" state, the multiplexer 15a outputs the data read from the register 11a to the first CPU 2. As a consequence, the first CPU 2 reads the data from the register 11a.

(5) The second CPU 6 usually writes the data to the dual port RAM 5 in accordance with the "Write Enable" state.

2-2. Case Where Operation Speed of First CPU 2 is Faster than That of Second CPU 6 (FIG. 4B)

In this case, the process is performed in the same way as that of 2-1. However, the first CPU 2 enters the "Read Enable" state, before the second CPU 6 enters the "Write Enable" state. Therefore, the multiplexer 15a outputs the data read from the register 11a to the first CPU 2.

2-3. Case Where Operation Speed of First CPU 2 is Slower than That of Second CPU 6 (FIG. 4C)

a. When Writing Occurs During Preparation of Reading

Since (1), (2), and (3) are the same as those of the case of 2-1, the description thereof will not be repeated.

(4) The second CPU 6 enters the "Write Enable" state before the first CPU 2 enters the "Read Enable" state. Therefore, the multiplexer 15a outputs the data read from the buffer memory 12b to the first CPU 2. As a consequence, the first CPU 2 reads the data of the buffer memory 12b.

(5) The second CPU 6 usually writes the data to the dual port RAM 5 in accordance with the "Write Enable" state.

(6) Since the collision ends but the reading of the first CPU 2 does not end, the data of the buffer memory 12b is held until the reading of the first CPU 2 ends.

b. Case Where Writing occurs During "Read Enable" State

Since (1), (2), and (3) are the same as those of the case of 2-1, the description thereof will not be repeated.

(4) Since the first CPU 2 has already entered the "Read Enable" state, the multiplexer 15a outputs the data read from the register 11a to the first CPU 2. As a consequence, the first CPU 2 reads the data of the register 11a.

(5) The second CPU 6 usually writes the data to the dual port RAM 5 in accordance with the "Write Enable" state.

Figure 5A:
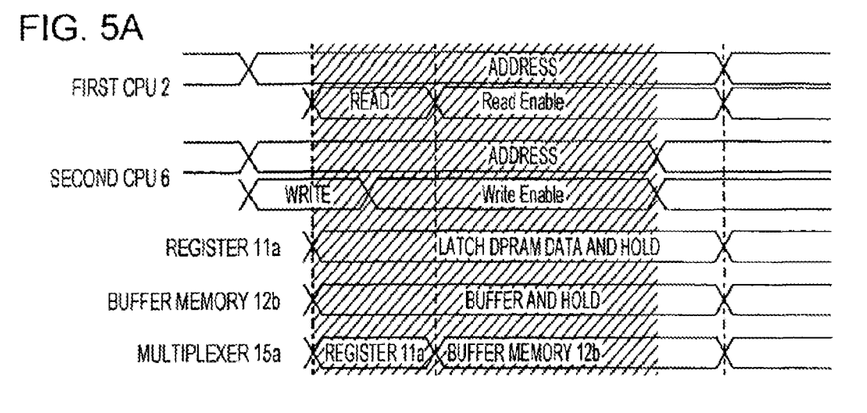
FIGS. 5A to 5C are timing charts illustrating an example in which the reading of the first CPU collides during the writing of the second CPU according to the embodiment of the invention.
Figure 5B:
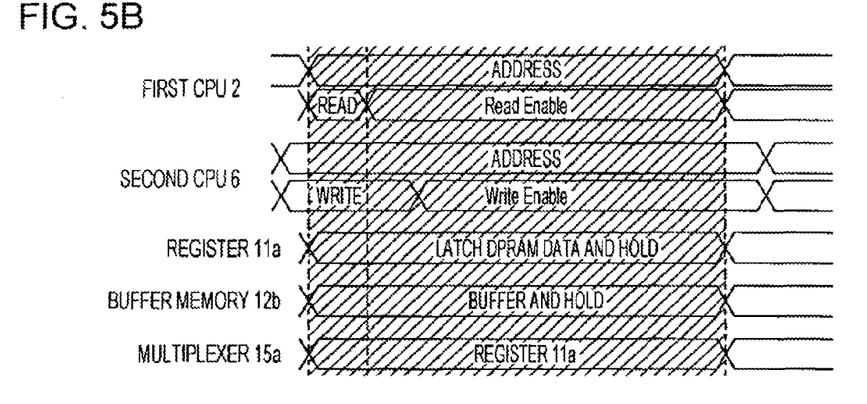
Figure 5C:
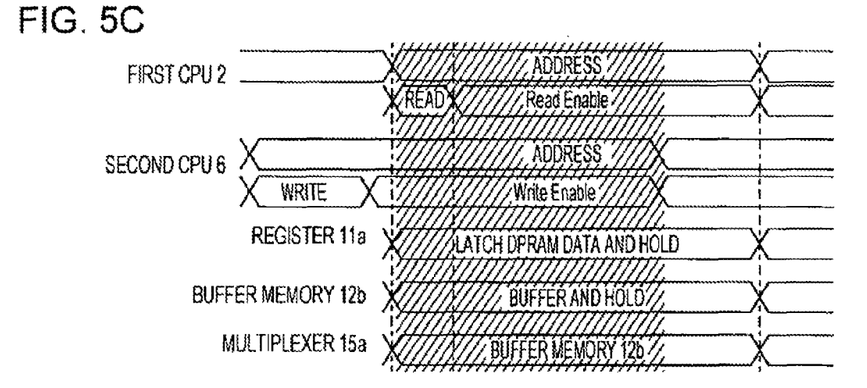

3. Case Where Reading of First CPU 2 Collides During Writing of Second CPU 6

Here, the multiplexers 15a and 15b perform the following process when the first CPU 2 read the data signal from the dual port RAM 5 during a period in which the second CPU 6 writes the data signal to the dual port RAM 5. At this time, it is necessary to detect the address collision. The multiplexers 15a and 15b switch the buffer memory 12b reading the data signals output by the multiplexers 15a and 15b in accordance with the operation speeds of the first CPU 2 and the second CPU 6, respectively.

Specifically, multiplexer 15a and 15b output the data signals written to the buffer memory 12b by the second CPU 6 when the operation timing of the first CPU 2 is the same as that of the second CPU 6. When the operation speed of the first CPU 2 is faster than the operation speed of the second CPU 6 and the reading is performed during preparation of the writing of the data signal, the first CPU 2 outputs the data signal written to the register 11a. When the operation speed of the first CPU 2 is faster than the operation speed of the second CPU 6 and the reading is performed during the writing of the data signal, the second CPU 6 outputs the data signal written to the buffer memory 12b. When the operation speed of the first CPU 2 is slower than the operation speed of the second CPU 6, the second CPU 6 outputs the data signal written to the buffer memory 12b.

Hereinafter, a detailed processing example will be described.

3-1. Case Where Speeds (Frequencies) of First CPU 2 and Second CPU 6 are Same as Each Other In this case, the process is performed both before and during the "Write Enable" state.

(1) The second CPU 6 starts preparing the writing.

(2) The address collision detection unit 14 detects the address collision.

(3) Like the case where the first CPU 2 performs normal reading, the read data from the dual port RAM 5 is latched in the register 11a.

(4) When the address collision detection unit 14 detects the address collision, the output of the dual port RAM 5 is buffered in the buffer memory 12b.

(5) When the first CPU 2 starts the reading, there is a possibility that the data of the register 11a has an undefined value since the writing is performed.

(6) On the other hand, the data of the buffer memory 12b also collides and then is buffered. However, since the buffer memory 12b buffers the data at the timing of the side of the writing from the port on the side of the writing, the data does not have an undefined value.

(7) When the first CPU 2 enters the "Read Enable" state, the second CPU 6 has already entered the "Write Enable" state.

(8) Accordingly, the multiplexer 15a outputs the data read from the stable buffer memory 12b to the first CPU 2. As a consequence, the first CPU 2 reads the data from the buffer memory 12b. However, there is a possibility that the data of the registered 11a prepared in the first CPU 2 has an undefined value.

(9) The second CPU 6 usually writes the data to the dual port RAM 5 in accordance with the "Write Enable" state.

(10) Although the collision ends, the first CPU 2 does not terminate the reading. Therefore, the data of the buffer memory 12b is held until the first CPU 2 terminates the reading.

3-2. Case Where Operation Speed of First CPU 2 is Faster than That of Second CPU 6 a. Case Where Reading Occurs During Preparation of Writing

Since (1), (2), (3), and (4) are the same as those of the case of 3-1, the description thereof will not be repeated.

(5) The first CPU 2 enters the "Read enable" state, before the second CPU 6 enters the "Write Enable" state. Therefore, the data of the register 11a becomes stable.

(6) The multiplexer 15a outputs the data read from the register 11a to the first CPU 2. As a consequence, the first CPU 2 reads the data of the register 11a.

(7) The second CPU 6 usually writes the data to the dual port RAM 5 in accordance with the "Write Enable" state.

b. Case Where Reading occurs During "Write Enable" State

Since (1), (2), (3), and (4) are the same as those of the case of 3-1, the description thereof will not be repeated.

(5) When the first CPU 2 starts the reading, there is a possibility that the data of the register 11a has an undefined value since the "Write Enable" state is already entered.

(6) On the other hand, the data of the buffer memory 12b is buffered in the "Write Enable" state. However, since the buffer memory 12b buffers the data from the port on the side of the writing at the timing of the side of the writing, the data does not have an undefined value.

(7) When the first CPU 2 enters the "Read Enable" state, the second CPU 6 has already entered the "Write Enable" state.

(8) Accordingly, the multiplexer 15a outputs the data read from the stable buffer memory 12b to the first CPU 2. As a consequence, the first CPU 2 reads the data from the buffer memory 12b. Therefore, there is a possibility that the data of the registered 11a prepared in the first CPU 2 has an undefined value.

(9) The second CPU 6 usually writes the data to the dual port RAM 5 in accordance with the "Write Enable" state.

(10) Although the collision ends, the first CPU 2 does not terminate the reading. Therefore, the data of the buffer memory 12b is held until the first CPU 2 terminates the reading.

3-3. Case Where Operation Speed of First CPU 2 is Slower than That of Second CPU 6

Since the second CPU 6 enters the "Write Enable" state earlier, as in the case a of 3-2, the multiplexer 15a outputs the data read from the buffer memory 12b to the first CPU 2.

Figure 6:
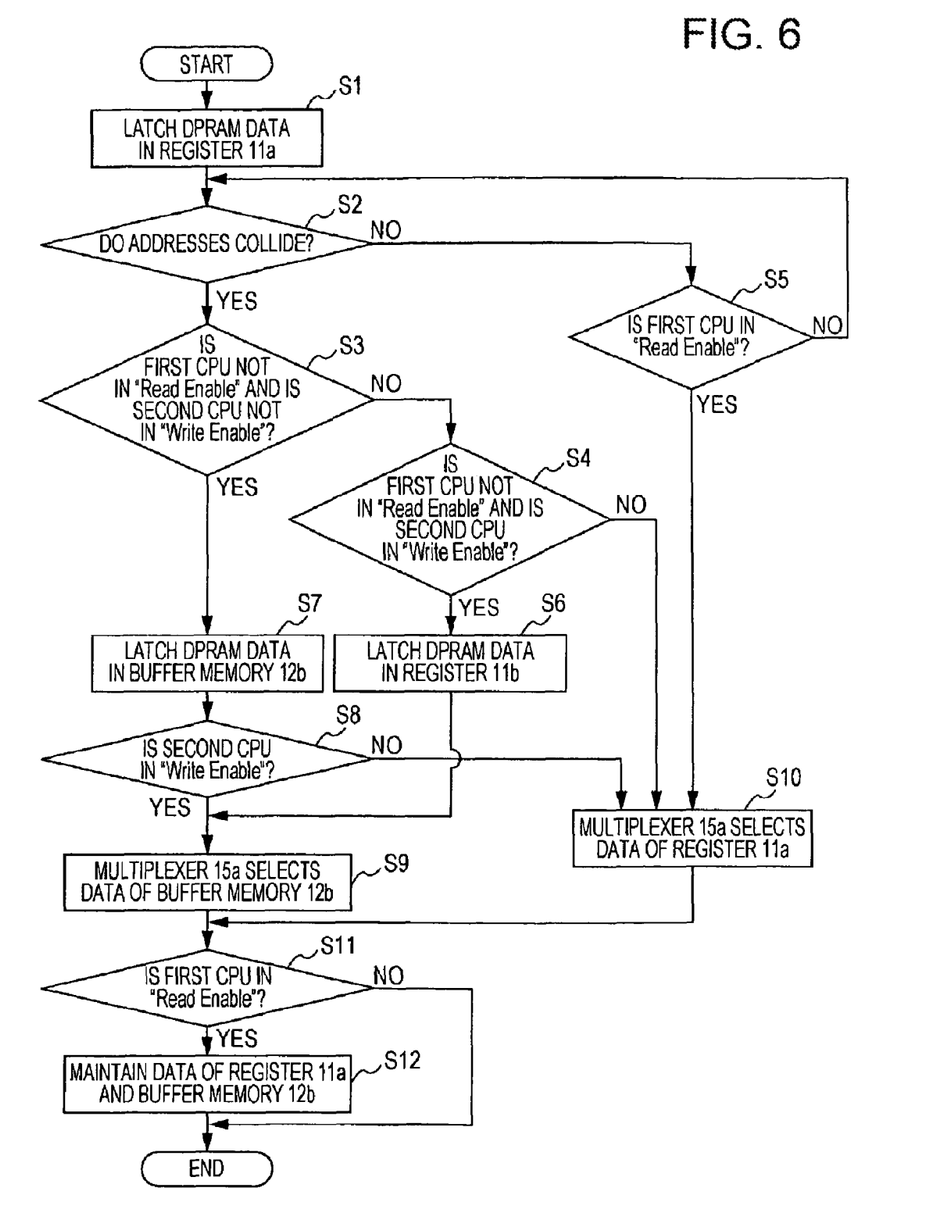
FIG. 6 is a flowchart illustrating an example of a signal control method according to the embodiment of the invention.

FIG. 6 is a diagram illustrating an example of a signal control method performed by the signal control device 4.

First, the first CPU 2 latches the data read from the dual port RAM 5 in the register 11a (step S1). Next, the address collision detection unit 14 determines whether addresses collide with each other (step S2).

When the address collision detection unit 14 determines that the addresses do not collide with each other in step S2, it is determined whether the first CPU 2 is in the "Read Enable" state (step S5). When it is determined that the first CPU 2 is in the "Read Enable" state in step S5, the process proceeds to step S10. On the other hand, when it is determined that the first CPU 2 is not in the "Read Enable" state, the process proceeds to step S2.

When the address collision detection unit 14 determines that the addresses collide with each other in step S2, the control unit 13 determines whether the first CPU 2 is not in the "Read Enable" state and the second CPU 6 is not in the "Write Enable" state (step S3). When the condition is not satisfied, the control unit 13 determines whether the first CPU 2 is not in the "Read Enable" state and the second CPU 6 is in the "Write Enable" state (step S4).

When the condition is satisfied in step S4, the second CPU 6 latches the data read from the DPRAM 5 in the buffer memory 12b (step S6), the process proceeds to step S9. On the other hand, when the condition is not satisfied in step S4, the process proceeds to step S9 without performing any process.

When the condition is satisfied in step S3, the second CPU 6 latches the data read from the DPRAM 5 in the buffer memory 12b (step S7).

Next, the control unit 13 determines whether the second CPU 6 is in the "Write Enable" state (step S8). When it is determined that the second CPU 6 is in the "Write Enable" state, the multiplexer 15a selects the data of the buffer memory 12a and outputs the data read from the buffer memory 12a (step S9).

On the other hand, when it is determined that the second CPU 6 is not in the "Write Enable" state in step S3 and step S8 or when it is determined that the first CPU 2 is in the "Read Enable" state in step S5, the following process is performed. That is, the multiplexer 15a selects the data of the register 11a and output the data read from the register 11a (step S10).

After the processes of step S9 and step S10, the control unit 13 determines whether the first CPU 2 is in the "Read Enable" state (step S11). When it is determined that the first CPU 2 is not in the "Read Enable" state, the process ends.

On the other hand, when it is determined that the first CPU 2 is in the "Read Enable" state, the control unit 13 holds the data of the register 11a and the buffer memory 12b, and then the process ends (step S12).

The signal control device 4 according to the above-described embodiment has an effective configuration when the first CPU 2 and the second CPU 6 gain access to the dual port RAM 5 and the first CPU 2 and the second CPU 6 simultaneously read and write the data from the ports of the dual port RAM 5, respectively. Here, the signal control device 4 includes the address collision detection unit 14 detecting the timing of the address collision in the writing and the reading. The second CPU 6 performing the writing includes the buffer memory 12b holding the read data in order to read the data from the dual port RAM 5 in the first operation of the series of writing operations. On the other hand, according to the determination of the address collision detection unit 14, the first CPU 2 performing the reading selects either of the data buffered by the second CPU 6 performing the writing or the data of the register 11a obtained by copying the details of the dual port RAM 5. Thus, the first CPU 2 can acquire the correct data stored in either thereof via the multiplexer 15a. The operation performed by the first CPU 2 can be performed in the second CPU 6 in the same manner.

By configuring the signal control device 4 in this way, the reading source of the data signal is switched based on the readable state or the writable state of the two CPUs even when the two CPUs simultaneously read and write the data from and to the dual port RAM 5. Therefore, the access can be realized at any timing without depending on the operation speed of the two CPUs. For example, when the "Read Enable" state of the first CPU 2 starts before the second CPU 6 enters the "Write Enable" state, the first CPU 2 reads the data latched in the register 11a on the side of the first CPU 2. Moreover, when the second CPU 6 enters the "Write Enable" state before the first CPU 2 enters the "Read Enable" state, the first CPU 2 reads the data buffered in the buffer memory 12b on the side of the second CPU 6. Thus, the output of the undefined value can be avoided without depending on the access timing of the mutual CPUs.

The advantage superior to the techniques (1) and (2) described according to the related art is that both the CPU performing the reading and the CPU performing the writing can gain access to the dual port RAM 5 freely and without restriction on the access timing or waste of waiting time. The advantage superior to the technique (3) is that the reading and the writing are achieved with minimal resources of the buffer and the controller. Moreover, data change can be avoided irrespective of synchronization or non-synchronization between the first CPU 2 and the second CPU 6.

One CPU can read or write data at a high speed without waiting until the process of the other CPU is completed. Moreover, a data buffering device, a data selection circuit, an address detection circuit, and the like can be configured with a simple and easy device in achieving the above advantage of reading and writing data at a high speed without waiting until the process of the other CPU is completed. Accordingly, manufacturing cost can be reduced.

Moreover, even when the access timings or the speeds of the first CPU 2 and the second CPU 6 are different from each other, an infinite value is not read. Just by adding a small amount of resources to the dual port RAM 5, the data change can be avoided when reading and writing data collide with each other.

The free access to the dual port RAM 5 can be achieved without restriction on the access timing which is the problem of the related art. Moreover, since it is not necessary to latch the written data, writing can continuously be performed while an address increments. Furthermore since there is no written latch, a small amount of resources is sufficient.

It should be understood by those skilled in the art that various modifications, combinations, sub-combinations and alterations may occur depending on design requirements and other factors insofar as they are within the scope of the appended claims or the equivalents thereof.

What is claimed is:

1. A signal control device comprising:
a dual port random access memory (RAM), wherein data signals are read from the dual port RAM by a first central processing unit (CPU) and written to the dual port RAM by a second CPU at predetermined operation timings, wherein the first CPU and the second CPU are connected to two ports of the dual port RAM;
an address collision detection unit which detects collision between an address from which the first CPU reads a data signal from the dual port RAM and an address in which the second CPU writes a data signal to the dual port RAM;
a first storage unit which stores the data signal which the first CPU reads from the dual port RAM;
a second storage unit which stores the data signal read from the address in which the second CPU writes the data signal to the dual port RAM, wherein the second storage unit stores the data signal irrespective of whether the second CPU is in a write enable state when the collision between the addresses is detected and the first CPU is not in a read enable state; and
a switching unit, located outside of the dual port RAM, that switches a reading source that outputs the data signal to the port to which the first CPU is connected, wherein the switching unit
reads the data signal from the first storage unit and outputs the read data signal from the first storage unit to the first CPU, when the collision between the addresses is not detected and the first CPU is in the read enable state,
reads the data signal from the first storage unit when the collision between the addresses is detected, the first CPU is not in the read enable state, and the second CPU is not in the write enable state, wherein the switching unit outputs the read data signal from the first storage unit to the first CPU when the first CPU enters the read enable state, and
reads the data signal from the second storage unit when the collision between the addresses is detected, the first CPU is not in the read enable state, and the second CPU is in the write enable state, wherein the switching unit outputs the read data signal from the second storage unit to the first CPU when the first CPU enters the read enable state.

2. The signal control device according to claim 1, wherein the switching unit switches reading of the data signal output between the first storage unit and second storage unit according to operation speeds of the first CPU and second CPU, when an operation timing at which the first CPU reads the data signal from the dual port RAM is the same as an operation timing at which the second CPU writes the data signal to the dual port RAM and thus the collision between the addresses is detected.

3. The signal control device according to claim 2, wherein the switching unit
outputs the data signal written to the first or second storage unit by the first CPU when the operation timings of the first CPU and second CPU are the same as each other,
outputs the data signal written to the second storage unit by the first CPU when the operation speed of the first CPU is faster than the operation speed of the second CPU, and
outputs the data signal written to the second storage unit by the second CPU when the operation speed of the first CPU is slower than the operation speed of the second CPU.

4. The signal control device according to claim 1, wherein the switching unit switches reading of the data signal output between the first storage unit and the second storage unit according to operation speeds of the first CPU and second CPU, when the second CPU writes the data signal to the dual port RAM during a period in which the first CPU reads the data signal from the dual port RAM and thus the collision between the addresses is detected.

5. The signal control device according to claim 4, wherein the switching unit
outputs the data signal written to the first storage unit by the first CPU when operation timings of the first CPU and the second CPU are the same as each other,
outputs the data signal written to the second storage unit by the first CPU when the operation speed of the first CPU is faster than the operation speed of the second CPU,
outputs the data signal written to the second storage unit by the second CPU when the operation speed of the first CPU is slower than the operation speed of the second CPU and the first CPU prepares to read the data signal from the dual port RAM, and
outputs the data signal written to the first storage unit by the first CPU when the operation speed of the first CPU is slower than the operation speed of the second CPU and the first CPU reads the data signal from the dual port RAM.

6. The signal control device according to claim 1, wherein the switching unit switches reading of the data signal output between the first storage unit and second storage unit according to operation speeds of the first CPU and second CPU, when the first CPU reads the data signal from the dual port RAM during a period in which the second CPU writes the data signal to the dual port RAM and thus the collision between the addresses is detected.

7. The signal control device according to claim 6, wherein the switching unit
outputs the data signal written to the second storage unit by the second CPU when operation timings of the first CPU and the second CPU are the same as each other,
outputs the data signal written to the first storage unit by the first CPU when the operation speed of the first CPU is faster than the operation speed of the second CPU and the reading is performed during preparation of the writing of the data signal,
outputs the data signal written to the second storage unit by the second CPU when the operation speed of the first CPU is faster than the operation speed of the second CPU and the reading is performed during the writing of the data signal, and
outputs the data signal written to the second storage unit by the second CPU when the operation speed of the first CPU is slower than the operation speed of the second CPU.

8. A signal control method comprising:
detecting collision between an address from which a first central processing unit (CPU) reads a data signal from a dual port random access memory (RAM) and an address in which a second CPU writes a data signal to the dual port RAM, wherein the data signals are read from and written in the dual port RAM at predetermined operation timings by the first CPU and the second CPU connected to two ports of the dual port RAM, respectively;

storing the data signal which the first CPU reads from the dual port RAM in a first storage unit;

storing the data signal read from the address in which the second CPU writes the data signal to the dual port RAM in a second storage unit, wherein the data signal is stored irrespective of whether the second CPU is in a write enable state when the collision between the addresses is detected and the first CPU is not in a read enable state; and switching a reading source that outputs the data signal to the port to which the first CPU is connected, wherein the switching of the reading source comprises:

reading the data signal from the first storage unit and outputting the read data signal from the first storage unit to the first CPU when the collision between the addresses is not detected and the first CPU is in the read enable state, reading the data signal from the first storage unit when the collision between the addresses is detected, the first CPU is not in the read enable state, and the second CPU is not in the write enable state, wherein the read data signal is outputted from the first storage unit to the first CPU when the first CPU enters the read enable state, and reading the data signal from the second storage unit when the collision between the addresses is detected, the first CPU is not in the read enable state, and the second CPU is in the write enable state, wherein the read data signal from the second storage unit is outputted to the first CPU when the first CPU enters the read enable state, and wherein the switching is performed outside of the dual port RAM.

9. The signal control device according to claim 1, wherein the address collision detection unit is located outside the dual port RAM.

10. The signal control device according to claim 1, wherein the first storage unit is located outside the dual port RAM.

11. The signal control device according to claim 1, wherein the second storage unit is located outside the dual port RAM.

\* \* \* \* \*